(12) United States Patent
Nakajima et al.

(10) Patent No.: US 9,313,433 B2
(45) Date of Patent: Apr. 12, 2016

(54) SOLID-STATE IMAGING DEVICE AND ELECTRONIC CAMERA

(71) Applicant: OLYMPUS CORPORATION, Tokyo (JP)

(72) Inventors: Shinichi Nakajima, Tokyo (JP); Yuichi Gomi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 107 days.

(21) Appl. No.: 14/080,270

(22) Filed: Nov. 14, 2013

(65) Prior Publication Data

US 2014/0146208 A1    May 29, 2014

(30) Foreign Application Priority Data

Nov. 29, 2012  (JP) .................................. 2012-260966

(51) Int. Cl.
  *H04N 5/369* (2011.01)
  *H04N 5/3745* (2011.01)
  *H04N 9/04* (2006.01)
  *H01L 27/146* (2006.01)
(52) U.S. Cl.
  CPC ........ *H04N 5/3696* (2013.01); *H01L 27/14634* (2013.01); *H01L 27/14638* (2013.01); *H04N 5/37457* (2013.01); *H04N 9/045* (2013.01)

(58) Field of Classification Search
  USPC .......................................... 348/345, 348, 350
  See application file for complete search history.

(56) References Cited

U.S. PATENT DOCUMENTS

| 2002/0125409 A1* | 9/2002 | Nagano ..................... 250/208.1 |
| 2004/0041927 A1* | 3/2004 | Cho et al. ..................... 348/254 |
| 2006/0023109 A1* | 2/2006 | Mabuchi et al. .............. 348/340 |

FOREIGN PATENT DOCUMENTS

| JP | 2003-244712 A | 8/2003 |
| JP | 2004-111590 A | 4/2004 |
| JP | 2007-243744 A | 9/2007 |

* cited by examiner

*Primary Examiner* — Sinh Tran
*Assistant Examiner* — Mark Monk
(74) *Attorney, Agent, or Firm* — Westerman, Hattori, Daniels & Adrian, LLP

(57) ABSTRACT

In a solid-state imaging device and an electronic camera, a first substrate of the solid-state imaging device includes first and second photoelectric converting units, a transfer unit that transfers signal charges of the first and second photoelectric converting units to a connector, and a microlens that causes light to be incident on the first and second photoelectric converting unit. A second substrate of the solid-state imaging device includes first and second memory units that hold signal charges transferred from one or the other of the first and second photoelectric converting unit to the connector and an averaging unit that averages the signal charges held in the first memory unit and the signal charge held in the second memory unit.

3 Claims, 11 Drawing Sheets

FIG. 9

SOLID-STATE IMAGING DEVICE AND ELECTRONIC CAMERA

BACKGROUND OF THE INVENTION

1. Field of the Invention

The present invention relates to a solid-state imaging device that outputs a focus detection signal and to an electronic camera using the same.

Priority is claimed on Japanese Patent Application No. 2012-260966, filed Nov. 29, 2012, the content of which is incorporated herein by reference.

2. Description of Related Art

In recent years, video cameras or electronic still cameras have become widely spread. In such cameras, a solid-state imaging device (solid-state imaging element) of a CCD type or an amplification type is used. The solid state imaging device includes a plurality of pixels arranged in the form of a two-dimensional matrix, and a photoelectric converting unit arranged in each pixel generates and accumulates charges according to incident light.

In the solid-state imaging device of the amplification type, signal charges generated and accumulated by the photoelectric converting unit of the pixel are led to a pixel amplifying unit arranged in the pixel, and an electric signal corresponding to the signal charges is output from the pixel through the pixel amplifying unit. As the solid-state imaging device of the amplification type, for example, a CMOS type solid-state imaging device using a MOS transistor as a pixel amplifying unit or the like has been proposed.

In a solid-state imaging device according to a related art disclosed in Japanese Unexamined Patent Application, First Publication No. 2004-111590, a photoelectric converting unit, a pixel amplifying unit, and a charge storing unit that is arranged between the photoelectric converting unit and the pixel amplifying unit and temporarily accumulates charges are arranged for each pixel. In the solid-state imaging device according to the related art, all pixels are simultaneously exposed to light, and then generated signal charges of all pixels are simultaneously transferred from the photoelectric converting unit to the charge storing unit and accumulated in the charge storing unit. Further, in units of rows, floating diffusion regions or control electrodes are reset, and signals that have been subjected to a correlated double sampling (CDS) process are output. As described above, in the solid-state imaging device disclosed in Japanese Unexamined Patent Application, First Publication No. 2004-111590, all pixels which have been subjected to the correlated double sampling can be simultaneously exposed to light.

In electronic cameras such as digital cameras, a pupil division phase difference technique is known as one of focus detection techniques. In the pupil division phase difference technique, light flux passing through a shooting lens is subjected to pupil division to generate a pair of division images, and a defocus amount of the shooting lens is detected by detecting deviation of the pattern.

Further, techniques of applying the pupil division phase difference technique to the solid-state imaging device have been proposed. For example, a solid-state imaging device including a pixel (an image signal pixel) that generates an image signal and a pixel (a focus detection pixel) that generates a signal for focus detection (a focus detection signal) has been proposed in Japanese Unexamined Patent Application, First Publication No. 2003-244712.

The focus detection pixel includes two photoelectric converting units. Further, the focus detection pixels are arranged not to be adjacent to each other. Further, when the focus detection signal is obtained, a signal of one of the two photoelectric converting units is read from an output unit of the focus detection pixel, and at the same time, a signal of the other photoelectric converting unit is read from an output unit of the neighboring image signal pixel.

Through this operation, the solid-state imaging device disclosed in Japanese Unexamined Patent Application, First Publication No. 2003-244712 can match the length and a timing of an exposure period of time in the two photoelectric converting units of the focus detection pixel. However, in the solid-state imaging device proposed in Japanese Unexamined Patent Application, First Publication No. 2003-244712, an exposure timing is the same in the same row, but an exposure timing of the focus detection signal is different between different rows. In other words, there is no simultaneity of an exposure timing in focus detection of effective pixels, and thus a focusing position varies in a single frame.

Meanwhile, a solid-state imaging device in which simultaneity of an exposure timing in focus detection in a single frame is secured has been proposed in Japanese Unexamined Patent Application, First Publication No. 2007-243744. In detail, in this solid-state imaging device, at least some of a plurality of pixels arranged in a two-dimensional form include a plurality of photoelectric converting units, and a plurality of charge storing units that receive and accumulate charges from the plurality of photoelectric converting units and a floating diffusion region that receives and accumulates charges from the plurality of charge storing units are provided corresponding to the plurality of photoelectric converting units. Further, a first transfer unit that transfers charges to each of the charge storing units corresponding to the plurality of photoelectric converting units, a second transfer unit that transfers charges to the floating diffusion region from the plurality of charge storing units, and microlenses that guide incident light to the plurality of photoelectric converting units are provided.

The incident light is converted into signal charges through the plurality of photoelectric converting units arranged in a pixel, and the signal charges are transferred to and accumulated in the charge storing units corresponding to the photoelectric converting units. Through this configuration, light exposure can be simultaneously performed in all pixels. In addition, the signal charges can be used as a focus detection signal, and simultaneity of an exposure timing can be secured in focus detection signals of a single frame.

SUMMARY OF THE INVENTION

According to a first aspect of the present invention, a solid-state imaging device includes a first substrate, a second substrate, and a connector that connects the first substrate with the second substrate. The first substrate includes a first photoelectric converting unit, a second photoelectric converting unit, a transfer unit that transfers signal charges of the first photoelectric converting unit and signal charges of the second photoelectric converting unit to the connector, and a microlens that causes light to be incident on the first photoelectric converting unit and the second photoelectric converting unit. The second substrate includes a first memory unit that holds the signal charges transferred from one of the first photoelectric converting unit and the second photoelectric converting unit to the connector, a second memory unit that holds the signal charges transferred from the other of the first photoelectric converting unit and the second photoelectric converting unit to the connector, and an averaging unit that averages the signal charges held in the first memory unit and the signal charges held in the second memory unit. At least one of the first substrate and the second substrate includes a control unit configured to perform a control in a first mode in which focus detection signals are individually read based on the signal charges held in the first memory unit and the signal charges held in the second memory unit and to perform a control in a second mode in which an imaging signal is read based on the signal charges averaged by the averaging unit.

According to a second aspect of the present invention, in the solid-state imaging device according to the first aspect, a plurality of unit pixels arranged in the form of a matrix may be provided, and the first photoelectric converting unit and the second photoelectric converting unit may be arranged corresponding to each of the unit pixels. The first mode may include a step of transferring the signal charges from one of the first photoelectric converting unit and the second photoelectric converting unit to the connector and holding the signal charges in the first memory unit at the same time in the plurality of unit pixels, a step of transferring the signal charges from the other of the first photoelectric converting unit and the second photoelectric converting unit to the connector and holding the signal charges in the second memory unit at the same time in the plurality of unit pixels, and a step of sequentially reading a focus detection signal based on the signal charges held in the first memory unit and a focus detection signal based on the signal charges held in the second memory unit in the unit pixels at the same vertical position.

Furthermore, according to a third aspect of the present invention, an electronic camera includes the solid-state imaging device according to the first aspect, a focus detecting unit that detects deviation of a pupil division image based on the focus detection signal output from the solid-state imaging device, and performs focus detection, and an image processing unit that processes the imaging signal output from the solid-state imaging device.

BRIEF DESCRIPTION OF THE DRAWINGS

FIG. 9 is a timing chart illustrating operations of a unit pixel cell and a unit storage cell in the solid-state imaging device equipped in the electronic camera according to the first embodiment of the present invention.

DETAILED DESCRIPTION OF THE INVENTION

Hereinafter, exemplary embodiments of the present invention will be described with reference to the accompanying drawings.

(First Embodiment)

Figure 1:
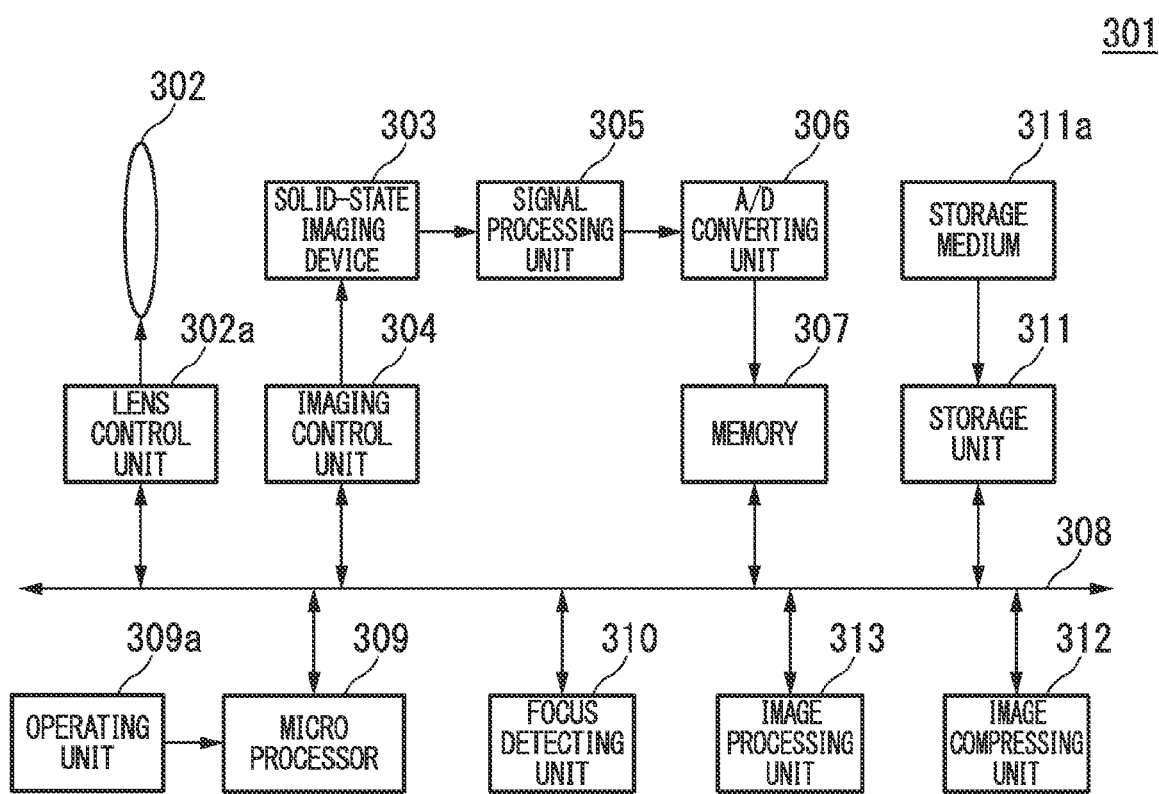
FIG. 1 is a block diagram illustrating a constitution of an electronic camera according to a first embodiment of the present invention.

First of all, a first embodiment of the present invention will be described. FIG. 1 illustrates a constitution of an electronic camera 301 according to the present embodiment. The electronic camera 301 includes a shooting lens 302, a lens control unit 302a, a solid-state imaging device 303, an imaging control unit 304, a signal processing unit 305, an A/D converting unit 306, a memory 307, a microprocessor 309, an operating unit 309a, a focus detecting unit 310, a storage unit 311, a storage medium 311a, an image compressing unit 312, and an image processing unit 313.

The shooting lens 302 is mounted in the electronic camera 301. The lens control unit 302a controls a focus or a diaphragm of the shooting lens 302. An imaging plane of the solid-state imaging device 303 is arranged in an image space of the shooting lens 302. The solid-state imaging device 303 converts light that passes through the shooting lens 302 and then is incident on the imaging plane into an electric signal. An operation of the solid-state imaging device 303 is controlled by the imaging control unit 304. A signal output from the solid-state imaging device 303 is an imaging signal or a focus detection signal. The signals are processed by the signal processing unit 305, converted into digital signals by the A/D converting unit 306, and then stored in the memory 307.

The signal processing unit 305 and the A/D converting unit 306 may be equipped in the solid-state imaging device 303. The memory 307 is connected to a bus 308. The lens control unit 302a, the imaging control unit 304, the microprocessor 309, the focus detecting unit 310, the storage unit 311, the image compressing unit 312, and the image processing unit 313 are also connected to the bus 308. The operating unit 309a having a release button and the like is connected to the microprocessor 309. The storage medium 311a is removably mounted in the storage unit 311.

The microprocessor 309 drives the imaging control unit 304 in synchronization with an operation made by pressing the release button of the operating unit 309a halfway The imaging control unit 304 reads the focus detection signal from the pixel arranged in the solid-state imaging device 303 and stores the focus detecting signal in the memory 307.

In the present embodiment, all effective pixels generate the focus detection signal. Further, all effective pixels generate an imaging signal at a timing different from a timing at which the focus detection signal is generated. The present invention is not limited to this example, and among the pixels arranged in the solid-state imaging device 303, at least some pixels may generate the focus detection signal. In this case, the remaining pixels output the imaging signal without outputting the focus detection signal.

When the focus detection signal is output from the solid-state imaging device 303 and accumulated in the memory 307 according to a command of the imaging control unit 304, the focus detecting unit 310 performs a focus detection operation process using the focus detection signal to calculate a defocus amount.

As will be described later, in the solid-state imaging device 303 of the present embodiment, a unit pixel that outputs the focus detection signal includes two photoelectric converting units. A shared single microlens is arranged above the two photoelectric converting units. The two focus detection signals output from the two photoelectric converting units become a pair (a set), and the defocus amount is calculated as follows through the pair of focus detection signals.

Light flux emitted from a point of a subject in a focused state passes through different positions of exit pupils of the shooting lens 302 and is then focused to form a point image on the imaging plane. For this reason, in the focused state, the two photoelectric converting units receive pupil division light flux emitted from the same point of the subject. Thus, a set of pupil division images obtained by the photoelectric converting units is approximately the same and a phase difference thereof is nearly zero.

Meanwhile, light flux emitted from a subject in a front focus state (a state in which a focal point is formed in front of a subject) passes through different positions of the exit pupils of the shooting lens 302, intersects in front of the imaging plane, and arrives at a pixel position deviated from a focusing position. In this case, the pair of pupil division images has a phase difference deviating in a pupil division direction. On the other hand, light flux emitted from a subject in a rear focus state (a state in which a focal point is formed behind a subject) passes through different positions of the exit pupils of the shooting lens 302, and arrives at a pixel position deviated from a focusing position in a less focused state. In this case, the pair of pupil division images has a phase difference deviating in an opposite direction to the front focus state. As described above, the phase difference of the pupil division images obtained from the two photoelectric converting units changes according to the focusing state of the shooting lens 302.

The focus detecting unit 310 divides the focus detection signals in the memory 307, and obtains image patterns of the pair of pupil division images. The focus detecting unit 310 performs a pattern matching process on the image patterns, and detects the phase difference (image deviation). Then, the focus detecting unit 310 detects the defocus amount of the shooting lens 302 based on the phase difference.

The defocus amount detected by the focus detecting unit 310 is transferred to the lens control unit 302a. The lens control unit 302a drives the shooting lens 302 based on the defocus amount and causes the shooting lens 302 to be focused on the subject. Thereafter, the microprocessor 309 starts an operation of reading the imaging signal through the imaging control unit 304 in synchronization with an operation made by fully pressing the release button of the operating unit 309a.

The imaging control unit 304 reads the imaging signals from the pixels, and accumulates the image signals in the memory 307. Thereafter, the microprocessor 309 causes the image processing unit 313 or the image compressing unit 312 to perform desired image processing as necessary based on a command input through the operating unit 309a, causes the processed signal to be output to the storage unit 311, and causes the processed signal to be recorded in the storage medium 311a.

Figure 2:
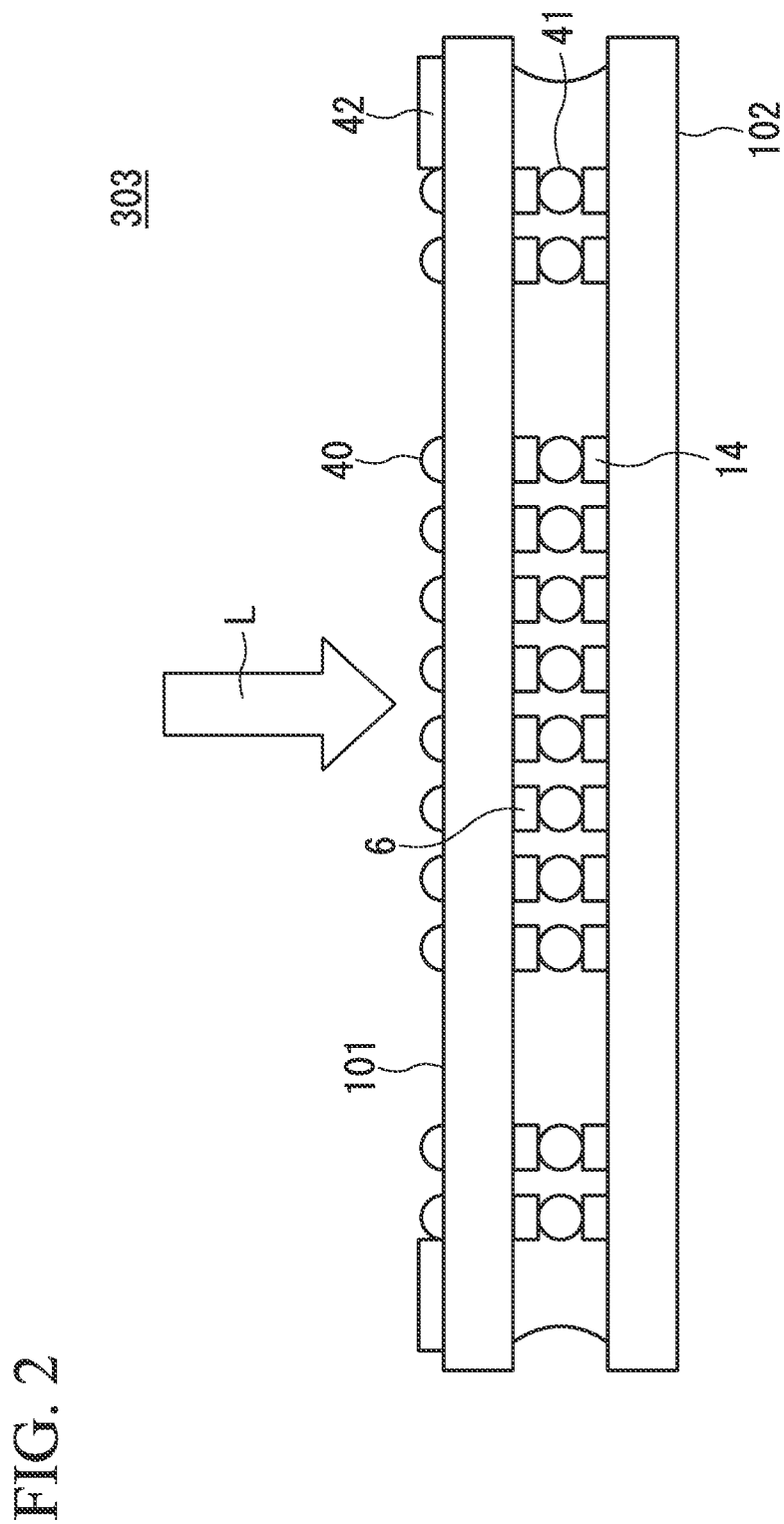
FIG. 2 is a cross-sectional view of a solid-state imaging device equipped in the electronic camera according to the first embodiment of the present invention.

FIG. 2 illustrates a constitution of the solid-state imaging device 303. The solid-state imaging device 303 has a structure in which two substrates (a first substrate 101 and a second substrate 102) on which circuit elements (a photoelectric converting element, a transistor, a capacitor, and the like) constituting the pixels are arranged are stacked. The circuit elements constituting the pixels are arranged on the first substrate 101 and the second substrate 102. The first substrate 101 is electrically connected with the second substrate 102 such that an electric signal can be exchanged between the two substrates when the pixels are driven.

Of two principal surfaces (surfaces having a surface area relatively larger than a side surface) of the first substrate 101, the photoelectric converting element is formed on the principal surface side to which light L is radiated, and light radiated to the first substrate 101 is incident on the photoelectric converting element. A microlens 40 that causes light to be incident on the photoelectric converting element is formed above the photoelectric converting element. Of the two principal surfaces of the first substrate 101, many micropads which are electrodes for connection with the second substrate 102 are formed on the principal surface at the opposite side to the principal surface at the side to which the light L is radiated as output terminals 6 at the first substrate 101 side. Further, of the two principal surfaces of the second substrate 102, many micropads which are electrodes for connection with the first substrate 101 are formed on the principal surface at the side facing the first substrate 101 at the positions corresponding to the output terminals 6 as input terminals 14 at the second substrate 102 side.

A microbump 41 is formed between the output terminal 6 and the input terminal 14. The first substrate 101 and the second substrate 102 are integrated such that the output terminal 6 and the input terminal 14 which are micropads, are arranged in an overlapping manner to face each other, and the output terminal 6 is electrically connected with the input terminal 14 through the microbump 41. The output terminal 6, the microbump 41, and the input terminal 14 constitute a connector that connects the first substrate 101 with the second substrate 102. A signal based on a signal charge generated by the photoelectric converting element arranged on the first substrate 101 is output to the second substrate 102 through the output terminal 6, the microbump 41, and the input terminal 14. Of the two principal surfaces of the first substrate 101, pads 42 used as an interface with a system other than the first substrate 101 and the second substrate 102 are formed on a peripheral portion of the principal surface on which the light L is incident.

In FIG. 2, a microbump is formed between micropads to connect the first substrate 101 with the second substrate 102, but the present invention is not limited to this example. For example, instead of forming a microbump, the first substrate 101 may be connected with the second substrate 102 by bonding a micropad (first electrode) formed on the surface of the first substrate 101 directly with a micropad (second electrode) formed on the surface of the second substrate 102.

For the components other than the pixel, signal exchange may need to be performed between the first substrate 101 and the second substrate 102. However, similarly to the case of the pixel, the first substrate 101 can be connected with the second substrate 102 using the micropad and the microbump, or the first substrate 101 can be connected with the second substrate 102 by directly connecting the micropads with each other.

The solid-state imaging device 303 of the present embodiment supports reading of a signal according to a plurality of reading schemes (modes). The reading scheme refers to a series of sequences until reading of a signal after light exposure in a pixel. Specifically, a reading scheme (first mode) of a signal for focus detection (a focus detection signal) and a reading scheme (second mode) of a signal for an image (an imaging signal) are known.

Figure 3:
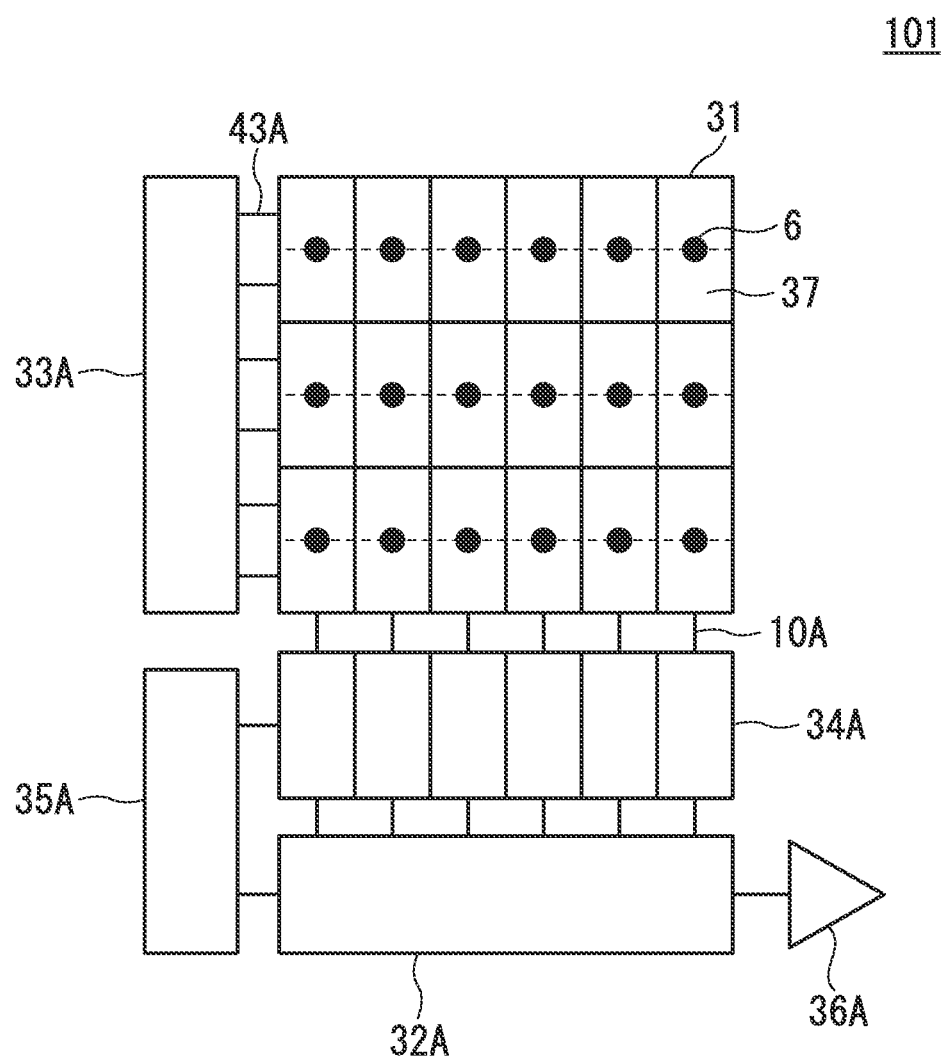
FIG. 3 is a block diagram illustrating a constitution of the solid-state imaging device equipped in the electronic camera according to the first embodiment of the present invention.

FIG. 3 illustrates a constitution of the first substrate 101. The first substrate 101 includes a unit pixel cell 31, a horizontal driving circuit 32A, a vertical driving circuit 33A, a column circuit unit 34A, a control circuit 35A, and an output circuit 36A.

The unit pixel cell 31 includes a plurality of unit pixels 37. In the present embodiment, the unit pixel cell 31 is constituted by the two unit pixels 37, each of which includes a photoelectric converting element, and the single microlens 40 (FIG. 2) is arranged above the two photoelectric converting elements. Thus, each photoelectric converting element can generate the focus detection signal. Further, the imaging signal can be obtained by averaging signals of the two photoelectric converting elements.

The unit pixels 37 are arranged in the form of a two-dimensional matrix, and belong to any one unit pixel cell 31 (group). An array of the unit pixels illustrated in FIG. 3 is an example, and the number of rows and the number of columns are preferably two or more. In the present embodiment, a region including all the unit pixels 37 of the solid-state imaging device 303 is referred to as a read target region of a signal. However, a part of the region including all the unit pixels 37 of the solid-state imaging device 303 may be referred to as a read target region. Preferably, the read target region includes all pixels in at least an effective pixel region. Further, the read target region may include an optical black pixel (a constantly light-shielded pixel) arranged outside the effective pixel region. For example, a signal read from the optical black pixel is used for correction of a dark current component.

The control circuit 35A receives an input clock, data for instructing an operation mode, or the like from the outside of the first substrate 101, and supplies a clock or a pulse necessary for operations of the respective components described below according to the received input clock or the received data. The vertical driving circuit 33A selects a row in the array of the unit pixels 37, and supplies the unit pixels 37 of the corresponding row with a control signal for controlling an operation of the unit pixels 37 through a control signal line 43A arranged for each row. The vertical driving circuit 33A supplies the unit pixels 37 with the control signal, and controls an operation of the unit pixels 37.

The unit pixels 37 output signals to a vertical signal line 10A arranged for each column according to control by the vertical driving circuit 33A. The vertical signal line 10A outputs the signals read from the unit pixels 37 to the column circuit unit 34A arranged for each column.

The column circuit unit 34A performs processing such as CDS (correlated double sampling: fixed pattern noise removal process) or signal amplification on the signals read out to the vertical signal line 10A. The column circuit unit 34A may perform AD conversion. The horizontal driving circuit 32A sequentially selects the column circuit unit 34A, and a signal processed by the column circuit unit 34A is output from the output circuit 36A. In the present embodiment, it is possible to cause the imaging signal to be output from the output circuit 36A by operating only the first substrate 101. However, this operation is unrelated to a feature of the present embodiment, and thus a detailed description thereof will be omitted. The output terminal 6 will be described later.

Figure 4:
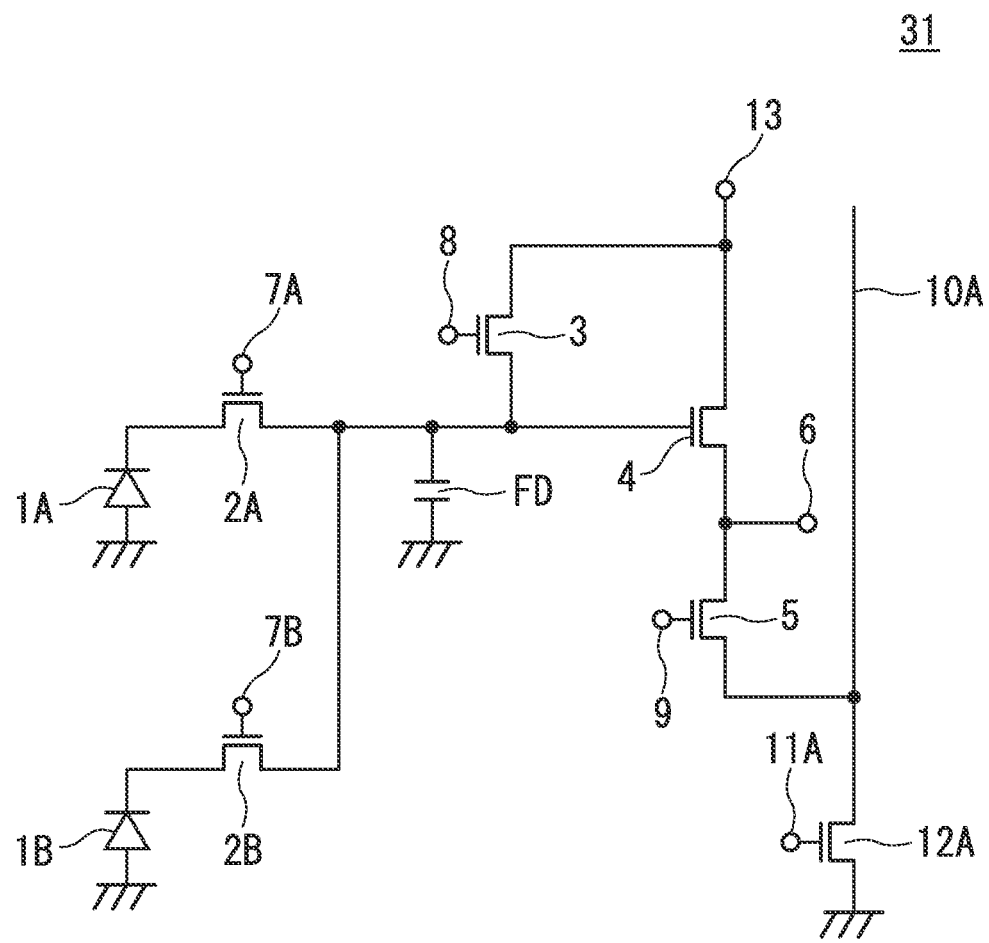
FIG. 4 is a circuit diagram illustrating a circuit constitution of a unit pixel cell in the solid-state imaging device equipped in the electronic camera according to the first embodiment of the present invention.

FIG. 4 illustrates a circuit constitution of the unit pixel cell 31 of the first substrate 101. In the following description, for each transistor, since a polarity of a transistor can be arbitrarily changed, a source and a drain of each transistor are not fixed. For this reason, one of a source or a drain of each transistor is referred to as a first terminal, and the other is referred to as a second terminal.

Photoelectric converting elements 1A and 1B are connected to first terminals of two corresponding transfer transistors 2A and 2B, respectively. Gates of the transfer transistors 2A and 2B are connected to transfer lines 7A and 7B which a transfer pulse is supplied. Second terminals of the transfer transistors 2A and 2B are connected in common to a first terminal of a reset transistor 3. Furthermore, one terminal of a charge holding unit FD is connected between the second terminals of the transfer transistors 2A and 2B and the first terminal of the reset transistor 3. One terminal of the charge holding unit FD is also connected to a gate of an amplifying transistor 4. The other end of the charge holding unit FD is connected to the ground potential.

A second terminal of the reset transistor 3 is connected to a power line 13, and a gate of the reset transistor 3 is connected to a reset line 8 which a reset pulse is supplied. A first terminal of the amplifying transistor 4 is connected to the power line 13. A first terminal of the selecting transistor 5 is connected to a second terminal of the amplifying transistor 4, and a second terminal of the selecting transistor 5 is connected to the vertical signal line 10A. A gate of the selecting transistor 5 is connected to a selection line 9 which a selection pulse is supplied. A middle point of a connection between the amplifying transistor 4 and the selecting transistor 5 is connected to the output terminal 6.

One end of the vertical signal line 10A is connected to a first terminal of the load transistor 12A. The other end of the vertical signal line 10A is connected to the column circuit unit 34A. The load transistor 12A is arranged for each column, corresponding to the vertical signal line 10A. A second terminal of the load transistor 12A is connected to the ground potential. A gate of the load transistor 12A is connected to a load line 11A. The transfer lines 7A and 7B, the reset line 8, the selection line 9, and the load line 11A constitute the control signal line 43A.

For example, each of the photoelectric converting elements 1A and 1B includes a photodiode. The photoelectric converting elements 1A and 1B generate signal charges based on incident light, and hold and accumulate the generated signal charges. The transfer transistors 2A and 2B are transistors that transfer the signal charges accumulated in the photoelectric converting elements 1A and 1B to the charge holding unit FD. The on/off operations of the transfer transistors 2A and 2B are controlled according to the transfer pulses supplied from the vertical driving circuit 33A through the transfer lines 7A and 7B, respectively. The charge holding unit FD constitutes an input portion of the amplifying transistor 4, and is a floating diffusion capacitor that temporarily holds and accumulates the signal charges transferred from the photoelectric converting elements 1A and 1B.

The reset transistor 3 is a transistor that resets the charge holding unit FD. The on/off operation of the reset transistor 3 is controlled according to a reset pulse supplied from the vertical driving circuit 33A through the reset line 8. When the charge holding unit FD is reset, a charge amount accumulated in the charge holding unit FD is controlled such that a state (potential) of the charge holding unit FD is set to a reference state (a reference potential or a reset level). The photoelectric converting elements 1A and 1B can be reset by turning on the reset transistor 3 and the transfer transistors 2A and 2B at the same time.

The amplifying transistor 4 is a transistor that outputs an amplification signal obtained by amplifying a signal based on the signal charge accumulated in the charge holding unit FD and input to its gate from the other end. The selecting transistor 5 is a transistor that selects the unit pixel cell 31 that outputs a signal to the vertical signal line 10A, and transfers an output of the amplifying transistor 4 to the vertical signal line 10A. The on/off operation of the selecting transistor 5 is controlled according to a selection pulse supplied from the vertical driving circuit 33A through the selection line 9. In the global shutter operation, the selecting transistor 5 is turned off, and a path involving the first substrate 101 and the second substrate 102 is selected as a path which a signal is read.

The load transistor 12A is a transistor that operates as a load of the amplifying transistor 4, and supplies an electric current for driving the amplifying transistor 4. The state of the load transistor 12A is controlled by a voltage signal supplied from the vertical driving circuit 33A through the load line 11A. The output terminal 6 outputs the amplification signal output from the amplifying transistor 4 to the second substrate 102.

A set of two pixels constitutes a single unit pixel cell 31 through the photoelectric converting elements 1A and 1B, the transfer transistors 2A and 2B, the reset transistor 3, the amplifying transistor 4, and the selecting transistor 5. The reset transistor 3, the amplifying transistor 4, and the selecting transistor 5 are shared by the two unit pixels 37.

Figure 5:
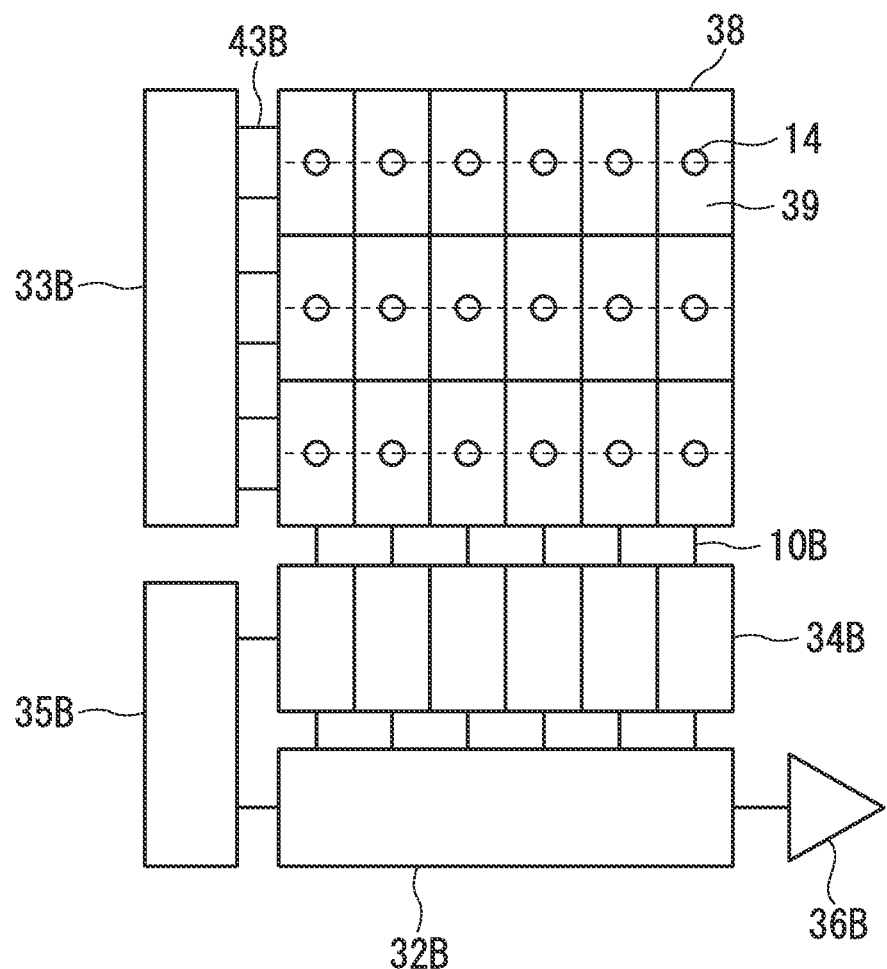
FIG. 5 is a block diagram illustrating a constitution of the solid-state imaging device equipped in the electronic camera according to the first embodiment of the present invention.

FIG. 5 illustrates a constitution of the second substrate 102. The second substrate 102 includes a unit storage cell 38, a horizontal driving circuit 32B, a vertical driving circuit 33B, a column circuit unit 34B, a control circuit 35B, and an output circuit 36B.

The unit storage cell 38 includes a plurality of unit storage units 39. In the present embodiment, the unit storage cell 38 is constituted by two unit storage units 39. The unit storage units 39 are arranged in the form of a two-dimensional matrix, and belong to any unit storage cell 38 (group). The unit storage unit 39 corresponds to the unit pixel 37. In the present embodiment, the unit pixel 37 is distinguished from the unit storage unit 39. However, the unit pixel 37 and the unit storage unit 39 may be collectively regarded as a pixel. An array of the unit storage units illustrated in FIG. 5 is an example, and the number of rows and the number of columns are preferably two or more.

The control circuit 35B receives an input clock, data for instructing an operation mode, or the like from the outside of the second substrate 102, and supplies a clock or a pulse necessary for operations of the respective components described below according to the received input clock or the received data. The vertical driving circuit 33B selects a row in the array of the unit storage units 39, and supplies the unit storage units 39 of the corresponding row with a control signal for controlling an operation of the unit storage units 39 through a control signal line 43B arranged for each row. The vertical driving circuit 33B supplies the unit storage units 39 with the control signal, and controls an operation of the unit storage units 39.

The unit storage unit 39 outputs signals to a vertical signal line 10B arranged for each column according to control by the vertical driving circuit 33B. The vertical signal line 10B outputs the signals read from the unit storage units 39 to the column circuit unit 34B arranged for each column. The column circuit unit 34B performs processing such as CDS or signal amplification on the signals read out to the vertical signal line 10B. The column circuit unit 34B may perform AD conversion. The horizontal driving circuit 32B sequentially selects the column circuit unit 34B, and a signal processed by the column circuit unit 34B is output from the output circuit 36B. The input terminal 14 will be described later.

In the present embodiment, the vertical driving circuits 33A and 33B are separately arranged on the two substrates, but the vertical driving circuits 33A and 33B may be arranged on the same substrate. For example, the vertical driving circuits 33A and 33B may be arranged on the first substrate 101, and the control signal may be supplied from the vertical driving circuit 33B to the second substrate 102. The above-described arrangement can be similarly applied to the control circuits 35A and 35B.

Figure 6:
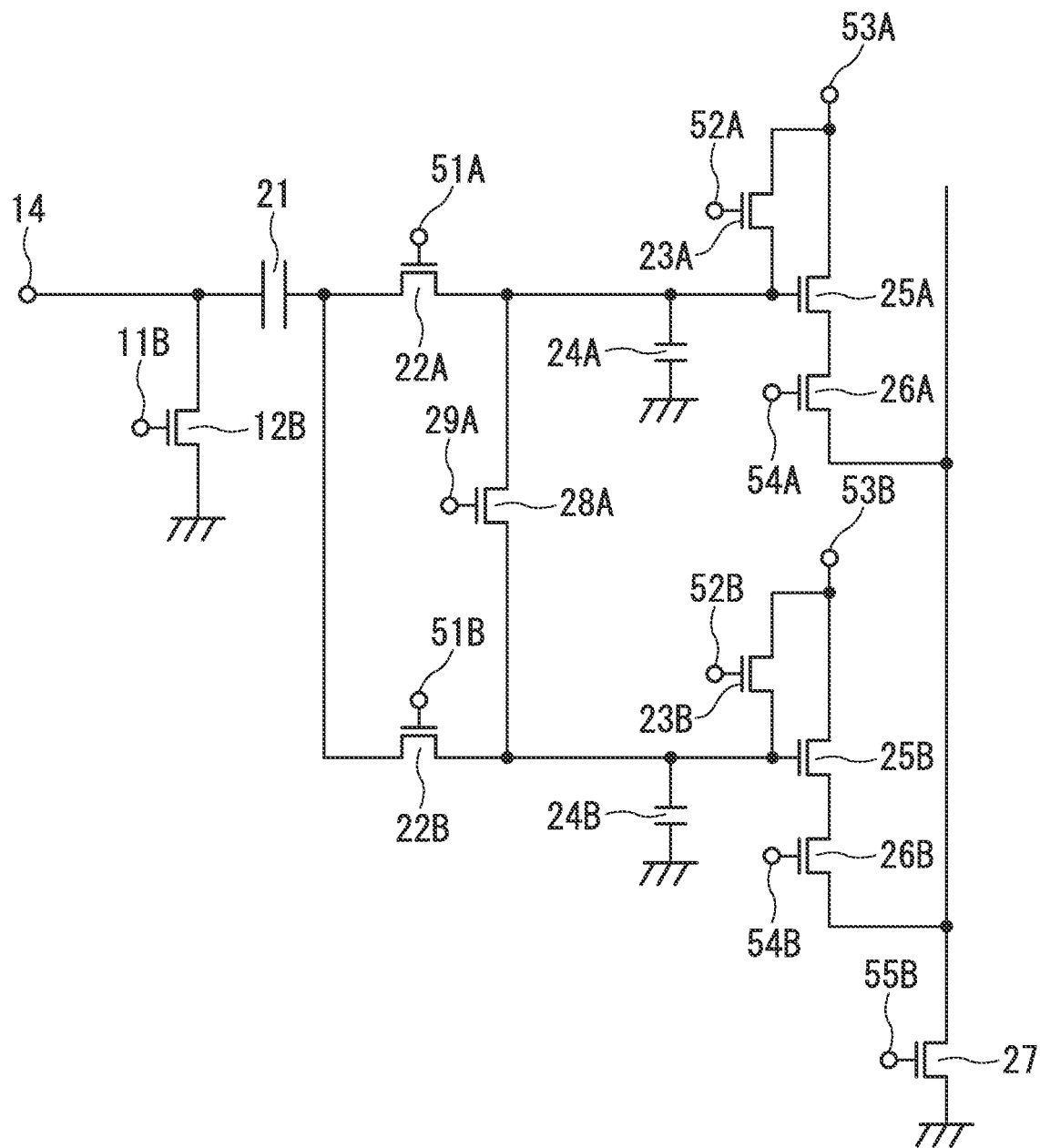
FIG. 6 is a circuit diagram illustrating a circuit constitution of a unit storage cell in the solid-state imaging device equipped in the electronic camera according to the first embodiment of the present invention.

FIG. 6 illustrates a circuit constitution of the unit storage cell 38 of the second substrate 102. The input terminal 14 is a terminal connected directly or indirectly to the output terminal 6 of the unit pixel cell 31, and is connected to a first terminal of a load transistor 12B. A second terminal of the load transistor 12B is connected to the ground potential. A gate of the load transistor 12B is connected to a load line 11B.

One end of a clamp capacitor 21 is connected to the input terminal 14. First terminals of sampling transistors 22A and 22B are connected to the other end of the clamp capacitor 21. Gates of the sampling transistors 22A and 22B are connected to sampling lines 51A and 51B which sampling pulses are supplied, respectively.

First terminals of the reset transistors 23A and 23B are connected to power lines 53A and 53B, respectively, and second terminals of the reset transistors 23A and 23B are connected to second terminals of the sampling transistors 22A and 22B, respectively. Gates of the reset transistors 23A and 23B are connected to reset lines 52A and 52B which reset pulses are supplied, respectively.

One end of each of analog memories 24A and 24B is connected to second terminals of the sampling transistors 22A and 22B, respectively, and the other ends of the analog memories 24A and 24B are connected to the ground potential. First terminals of amplifying transistors 25A and 25B are connected to the power lines 53A and 53B, respectively. Gates constituting input portions of the amplifying transistors 25A and 25B are connected to second terminals of the sampling transistors 22A and 22B, respectively.

First terminals of selecting transistors 26A and 26B are connected to second terminals of the amplifying transistors 25A and 25B, respectively, and second terminals of the selecting transistors 26A and 26B are connected to the vertical signal line 10B. Gates of the selecting transistors 26A and 26B are connected to selection lines 54A and 54B which selection pulses are supplied, respectively.

One end of the vertical signal line 10B is connected to a first terminal of a load transistor 27. The other end of the vertical signal line 10B is connected to the column circuit unit 34B. The load transistor 27 is arranged for each column, corresponding to the vertical signal line 10B. A second terminal of the load transistor 27 is connected to the ground potential. A gate of the load transistor 27 is connected to a load line 55B.

A first terminal of an averaging transistor 28A is connected to a second terminal of the sampling transistor 22A, and a second terminal of the averaging transistor 28A is connected to a second terminal of the sampling transistor 22B. A gate of the averaging transistor 28A is connected to a sampling line 29A which a sampling pulse is supplied.

The load line 11B, the sampling lines 51A and 51B, the reset lines 52A and 52B, the selection lines 54A and 54B, the load line 55B, and the sampling line 29A constitute the control signal line 43B.

A signal output from the output terminal 6 of the first substrate 101 is input to the input terminal 14. The load transistor 12B is a transistor that operates a load of the amplifying transistor 4, and supplies an electric current for driving the amplifying transistor 4 to the amplifying transistor 4. A state of the load transistor 12B is controlled according to a voltage signal supplied from the vertical driving circuit 33B through the load line 11B.

The clamp capacitor 21 is a capacitor that clamps (fixes) a voltage level of a signal input to the input terminal 14. The sampling transistors 22A and 22B are transistors that sample and hold a voltage level of the other end of the clamp capacitor 21 and accumulate resultant data in the analog memories 24A and 24B, respectively. The on/off operations of the sampling transistors 22A and 22B are controlled according to sampling pulses supplied from the vertical driving circuit 33B through the sampling lines 51A and 51B.

The reset transistors 23A and 23B are transistors that reset the analog memories 24A and 24B, respectively. The on/off operations of the reset transistors 23A and 23B are controlled according to reset pulses supplied from the vertical driving circuit 33B through the reset lines 52A and 52B, respectively. When the analog memories 24A and 24B are reset, charge amounts accumulated in the analog memories 24A and 24B are controlled such that states (potentials) of the analog memories 24A and 24B are set to a reference state (a reference potential or a reset level). The analog memories 24A and 24B hold and accumulate analog signals sampled and held by the sampling transistors 22A and 22B, respectively.

The capacities of the analog memories 24A and 24B are set to capacities larger than the capacity of the charge holding unit FD. Metal insulator metal (MIM) capacitors or metal oxide semiconductor (MOS) capacitors having small leakage current (dark current) per unit area are preferably used as the analog memories 24A and 24B. Thus, resistance to noise is improved, and a high quality signal is obtained.

The amplifying transistors 25A and 25B are transistors that output amplification signals obtained by amplifying signals based on the signal charges which are accumulated in the analog memories 24A and 24B and input to their gates from the second terminals, respectively. The selecting transistors 26A and 26B are transistors that select the unit storage units 39, and transfer outputs of the amplifying transistors 25A and 25B to the vertical signal line 10B, respectively. The on/off operations of the selecting transistors 26A and 26B are controlled according to selection pulses supplied from the vertical driving circuit 33B through the selection lines 54A and 54B, respectively.

In the global shutter operation, the selecting transistors 26A and 26B are turned on, and a path involving the first substrate 101 and the second substrate 102 is selected as a path which a signal is read.

The load transistor 27 is a transistor that operates as a load of the amplifying transistors 25A and 25B, and supplies an electric current for driving the amplifying transistors 25A and 25B. The state of the load transistor 27 is controlled by a voltage signal supplied from the vertical driving circuit 33B through the load line 55B.

The averaging transistor 28A performs an averaging process of averaging the signal charge accumulated in the analog memory 24A and the signal charge accumulated in the analog memory 24B. The on/off operation of the averaging transistor 28A is controlled according to a sampling pulse supplied from the vertical driving circuit 33B through the sampling line 29A.

A set of two unit storage units 39 constitutes a single unit storage cell 38 through the load transistor 12B, the clamp capacitor 21, the sampling transistors 22A and 22B, the reset transistors 23A and 23B, the analog memories 24A and 24B, the amplifying transistors 25A and 25B, the selecting transistors 26A and 26B, and the averaging transistor 28A. The load transistor 12B, the clamp capacitor 21, and the averaging transistor 28A are shared by the two unit storage units 39.

Figure 7A:
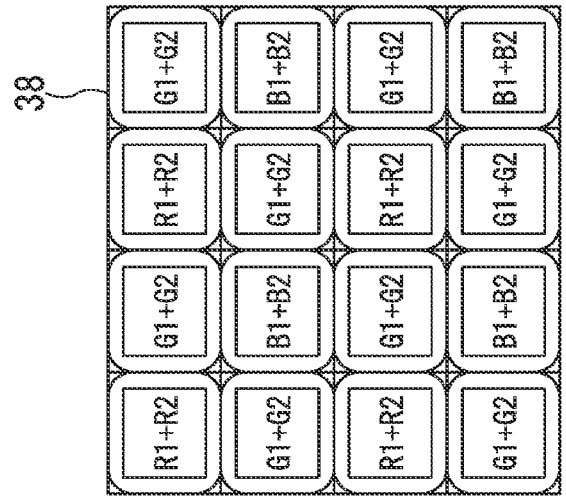
FIG. 7A is a reference diagram illustrating a correspondence relationship between unit pixels 37 and respective colors in the solid-state imaging device equipped in the electronic camera according to the first embodiment of the present invention.
Figure 7B:
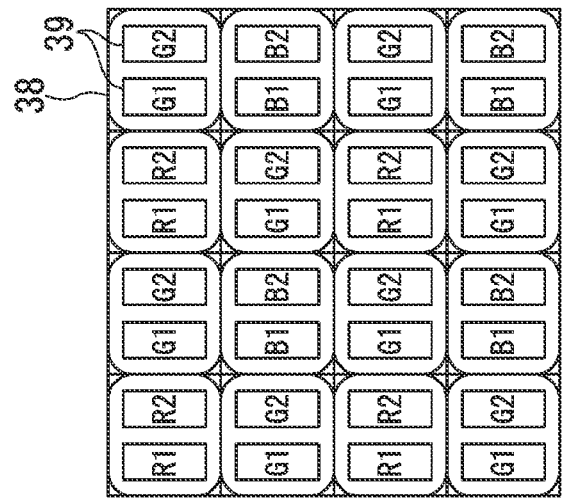
FIG. 7B is a reference diagram illustrating a correspondence relationship between unit storage units 39 and respective colors when a focus detection signal is obtained in the solid-state imaging device equipped in the electronic camera according to the first embodiment of the present invention.
Figure 7C:
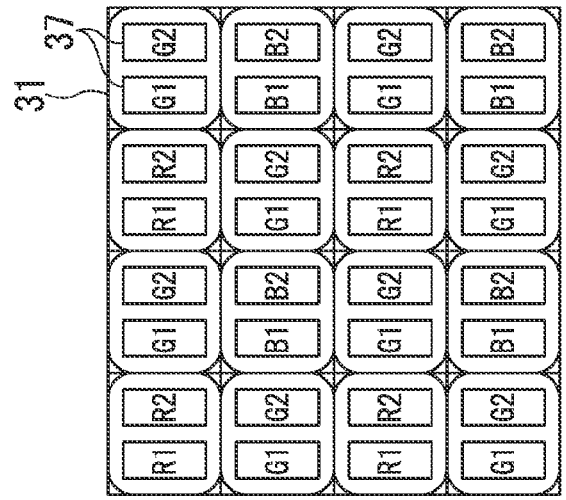
FIG. 7C is a reference diagram illustrating a correspondence relationship between unit storage cells 38 and respective colors when an imaging signal is obtained in the solid-state imaging device equipped in the electronic camera according to the first embodiment of the present invention.

The unit pixels 37 in the unit pixel cell 31 and the unit storage units 39 in the unit storage cell 38 are arranged in a Bayer array in which the four unit pixels 37 and the four unit storage units 39 respectively corresponding to red (R), green (Gr, Gb), and blue (B) are used as an array unit. FIG. 7A illustrates a correspondence relationship between the unit pixels 37 and respective colors, and FIG. 7B illustrates a correspondence relationship between the unit storage units 39 and respective colors when a focus detection signal is obtained. As illustrated in FIGS. 7A and 7B, signals of the two unit pixels 37 constituting the single unit pixel cell 31 are stored in the unit storage units 39, respectively, and the focus detection signal is obtained by individually reading the signals. FIG. 7C illustrates a correspondence relationship between the unit storage cells 38 and respective colors when an imaging signal is obtained. As illustrated in FIG. 7C, the imaging signal is obtained by averaging signals of the two unit storage units 39 constituting the single unit storage cell 38 and reading the averaged signal.

Figure 8:
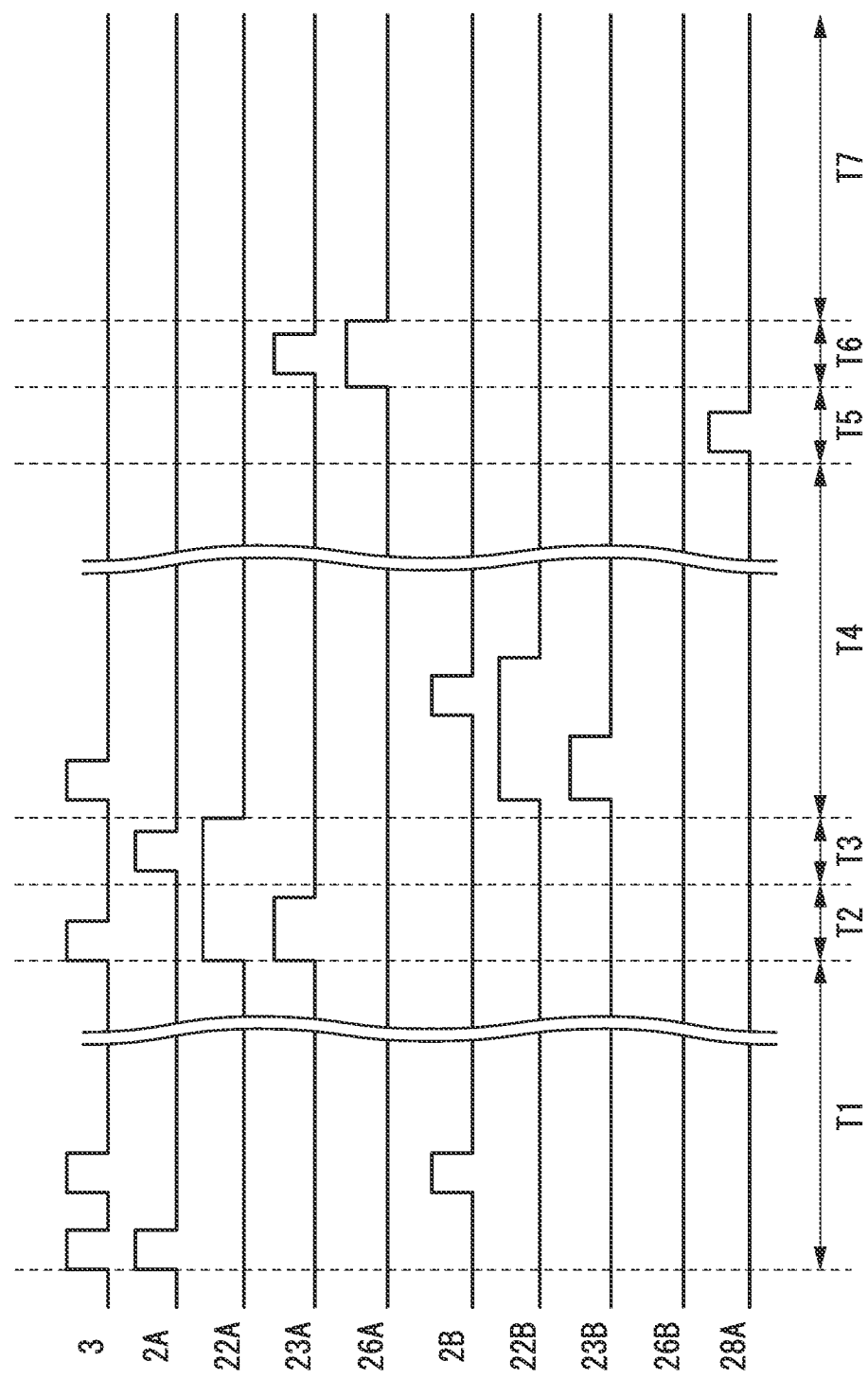
FIG. 8 is a timing chart illustrating operations of a unit pixel cell and a unit storage cell in the solid-state imaging device equipped in the electronic camera according to the first embodiment of the present invention.

Next, operations (the global shutter operation) of the unit pixel cell 31 and the unit storage cell 38 when signals are read through both the first substrate 101 and the second substrate 102 will be described with reference to FIG. 8. FIG. 8 illustrates control signals supplied from the vertical driving circuits 33A and 33B to the unit pixel cell 31 and the unit storage cell 38 in association with reference numerals of circuit elements to which the control signals are supplied. FIG. 8 illustrates an exemplary operation of reading the imaging signal by performing the averaging process on the signal charges in the unit storage units 39.

In the global shutter operation, since an operation of reading a signal out to the vertical signal line 10A through the selecting transistor 5 is not performed, the selection pulse is not supplied from the vertical driving circuit 33A to the selecting transistor 5 and the voltage signal is not supplied from the vertical driving circuit 33A to the load transistor 12A. Further, a predetermined voltage is applied from the vertical driving circuit 33B to the load transistor 12B, and a driving current is supplied to the amplifying transistor 4.

[Operation of Period of Time T1]

First of all, as the reset pulse supplied from the vertical driving circuit 33A to the reset transistor 3 transitions from the "L" (Low) level to the "H" (High) level, the reset transistor 3 is turned on. At the same time, as the transfer pulse supplied from the vertical driving circuit 33A to the transfer transistor 2A transitions from the "L" level to the "H" level, the transfer transistor 2A is turned on. Through this operation, the photoelectric converting element 1A is reset.

Thereafter, as the reset pulse supplied from the vertical driving circuit 33A to the reset transistor 3 and the transfer pulse supplied from the vertical driving circuit 33A to the transfer transistor 2A transition from the "H" level to the "L" level, the reset transistor 3 and the transfer transistor 2A are turned off. Through this operation, the resetting of the photoelectric converting element 1A ends, and light exposure (accumulation of signal charges) of the photoelectric converting element 1A starts. Thereafter, through an operation similar to the above-described operation, the photoelectric converting element 1B is reset, and light exposure of the photoelectric converting element 1B starts.

[Operation of Period of Time T2]

Thereafter, as the reset pulse supplied from the vertical driving circuit 33B to the reset transistor 23A transitions from the "L" level to the "H" level, the reset transistor 23A is turned on. Through this operation, the analog memory 24A is reset. At the same time, as the sampling pulse supplied from the vertical driving circuit 33B to the sampling transistor 22A transitions from the "L" level to the "H" level, the sampling transistor 22A is turned on. Through this operation, potential of the other end of the clamp capacitor 21 is reset to a power voltage, and the sampling transistor 22A starts sampling and holding of potential of the other end of the clamp capacitor 21.

Thereafter, as the reset pulse supplied from the vertical driving circuit 33A to the reset transistor 3 transitions from the "L" level to the "H" level, the reset transistor 3 is turned on. Through this operation, the charge holding unit FD is reset. Thereafter, as the reset pulse supplied from the vertical driving circuit 33A to the reset transistor 3 transitions from the "H" level to the "L" level, the reset transistor 3 is turned off. Through this operation, the resetting of the charge holding unit FD ends. Preferably, a timing at which the charge holding unit FD is reset is within the exposure period of time. However, when the charge holding unit FD is reset at a timing immediately before the exposure period of time ends, noise by a leakage current of the charge holding unit FD can be further reduced.

Thereafter, as the reset pulse supplied from the vertical driving circuit 33B to the reset transistor 23A transitions from the "H" level to the "L" level, the reset transistor 23A is turned off. Through this operation, the resetting of the analog memory 24A ends. At this time, the clamp capacitor 21 clamps the amplification signal (the amplification signal after the charge holding unit FD is reset) output from the amplifying transistor 4.

[Operation of Period of Time T3]

First of all, as the transfer pulse supplied from the vertical driving circuit 33A to the transfer transistor 2A transitions from the "L" level to the "H" level, the transfer transistor 2A is turned on. Through this operation, the signal charges accumulated in the photoelectric converting element 1A are transferred to the charge holding unit FD through the transfer transistor 2A, and accumulated in the charge holding unit FD. Through this operation, the light exposure (accumulation of signal charges) of the photoelectric converting element 1A ends. A period of time from the exposure start of the photoelectric converting element 1A in the period of time T1 to the exposure end of the photoelectric converting element 1A in the period of time T3 is the exposure period of time (signal accumulation period of time). Thereafter, as the transfer pulse supplied from the vertical driving circuit 33A to the transfer transistor 2A transitions from the "H" level to the "L" level, the transfer transistor 2A is turned off.

Thereafter, as the sampling pulse supplied from the vertical driving circuit 33B to the sampling transistor 22A transitions from the "H" level to the "L" level, the sampling transistor 22A is turned off. Through this operation, the sampling transistor 22A ends the sampling and holding of the potential of the other end of the clamp capacitor 21.

[Operation of Period of Time T4]

The operations in the periods of time T2 and T3 are the operations of the unit pixel 37 including the photoelectric converting element 1A and the unit storage unit 39 including the analog memory 24A. In a period of time T4, an operation similar to the periods of time T2 and T3 is performed on the unit pixel 37 including the photoelectric converting element 1B and the unit storage unit 39 including the analog memory 24B. In FIG. 8, due to limitations of space in the drawing, the respective photoelectric converting elements are different in the duration of the exposure period of time, but it is preferable that the respective photoelectric converting elements be the same in the duration of the exposure period of time.

Next, a change in potential of one end of the analog memory 24A will be described. The same aspect is shown in a change in potential of one end of the analog memory 24B. When a change in the potential of one end of the charge holding unit FD is represented by $\Delta Vfd$ and a gain of the amplifying transistor 4 is represented by $\alpha 1$ as the signal charges are transferred from the photoelectric converting element 1A to the charge holding unit FD after the resetting of the charge holding unit FD ends, a change $\Delta Vamp1$ in potential of the second terminal of the amplifying transistor 4 as the signal charges are transferred from the photoelectric converting element 1A to the charge holding unit FD is $\alpha 1 \times \Delta Vfd$.

When the sum of the gains of the analog memory 24A and the sampling transistor 22A is represented by $\alpha 2$, a change $\Delta Vmem$ in potential of one end of the analog memory 24A by the sampling and holding of the sampling transistor 22A after the signal charges are transferred from the photoelectric converting element 1A to the charge holding unit FD is $\alpha 2 \times \Delta Vamp1$, that is, $\alpha 1 \times \alpha 2 \times \Delta Vfd$. $\Delta Vfd$ is an amount of change in the potential of one end of the charge holding unit FD by the transfer of the signal charges, and does not include reset noise generated as the charge holding unit FD is reset. Thus, as the sampling transistor 22A performs sampling and holding, influence of noise generated in the first substrate 101 can be reduced.

Since potential of one end of the analog memory 24A when the resetting of the analog memory 24A ends is a power voltage VDD, potential Vmem of one end of the analog memory 24A sampled and held by the sampling transistor 22A after the signal charges are transferred from the photoelectric converting element 1A to the charge holding unit FD is obtained as in the following Equation (1):

$$Vmem = VDD + \Delta Vmem = VDD + \alpha 1 \times \alpha 2 \times \Delta Vfd \quad (1)$$

In Equation (1), $\Delta Vmem < 0$, and $\Delta Vfd < 0$.

Further, $\alpha 2$ is obtained by the following Equation (2). In Equation (2), CL represents a capacitance value of the clamp capacitor 21, and CSH represents a capacitance value of the analog memory 24A. In order to further reduce a reduction in gain, the capacitance CL of the clamp capacitor 21 is preferably larger than the capacitance CSH of the analog memory 24A.

$$\alpha 2 = CL/(CL + CSH) \quad (2)$$

[Operation of Period of Time T5]

In a period of time T5, as the sampling pulse supplied from the vertical driving circuit 33B to the averaging transistor 28A transitions from the "L" level to the "H" level, the averaging transistor 28A is turned on. Through this operation, potential of one end of the analog memory 24A becomes equal to potential of one end of the analog memory 24B, and the signal charges in the respective analog memories are averaged. This operation ends when the sampling pulse supplied from the vertical driving circuit 33B to the averaging transistor 28A transitions from the "H" level to the "L" level.

[Operation of Period of Time T6]

In a period of time T6, a signal based on the signal charges accumulated in the analog memory 24A is read. However, signal reading is not performed on the analog memory 24B. As the selection pulse supplied from the vertical driving circuit 33B to the selecting transistor 26A transitions from the "L" level to the "H" level, the selecting transistor 26A is turned on. Through this operation, a signal based on the potential Vmem illustrated in Equation (1) is output to the vertical signal line 10B through the selecting transistor 26A.

Thereafter, as the reset pulse supplied from the vertical driving circuit 33B to the reset transistor 23A transitions from the "L" level to the "H" level, the reset transistor 23A is turned on. Through this operation, the analog memory 24A is reset, a signal based on the potential of one end of the analog memory 24A at the time of resetting is output to the vertical signal line 10B through the selecting transistor 26A.

Thereafter, as the reset pulse supplied from the vertical driving circuit 33B to the reset transistor 23A transitions from the "H" level to the "L" level, the reset transistor 23A is turned off. Thereafter, as the selection pulse supplied from the vertical driving circuit 33B to the selecting transistor 26A transitions from the "H" level to the "L" level, the selecting transistor 26A is turned off.

The column circuit unit 34B generates a differential signal according to a difference between the signal based on the potential Vmem illustrated in Equation (1) and a signal based on the potential of one end of the analog memory 24A when the analog memory 24A is reset. The differential signal is a signal based on the difference between the potential Vmem illustrated in Equation (1) and the power voltage VDD, and is a signal based on a difference $\Delta Vfd$ between potential of one end of the charge holding unit FD immediately after the signal charges accumulated in the photoelectric converting elements 1A and 1B are transferred to the charge holding unit FD and potential of the charge holding unit FD immediately after one end of the charge holding unit FD is reset.

Thus, in the present embodiment, a signal component can be obtained, in which a noise component generated as the analog memory 24A is reset and a noise component generated as the charge holding unit FD is reset are suppressed, based on the signal charges accumulated in the photoelectric converting elements 1A and 1B.

A signal output from the column circuit unit 34B is output from the output circuit 36B through the horizontal driving circuit 32B. In this way, reading of a signal from the unit storage unit 39 including the analog memory 24A ends. In an operation of reading the imaging signal, in a period of time T7, reading of a signal from the same unit storage cell 38 as the unit storage cell 38 which has been subjected to signal reading in the period of time T6 is not performed.

In the normal global shutter operation, the signal charges transferred from the photoelectric converting element to the charge holding unit FD have to be held until the charge holding unit FD reads the pixels. When noise occurs during a period of time in which the charge holding unit FD is holding the signal charges, noise overlaps the signal charges held in the charge holding unit FD, and thus a signal quality (S/N) deteriorates.

Main factors of the noise occurring during a period of time (hereinafter referred to as a "holding period of time") in which the charge holding unit FD is holding the signal charges include charges (hereinafter referred to as "leakage charges") generated due to a leakage current of the charge holding unit FD and charges (hereinafter referred to as "optical charges") caused by light incident on a portion other than the photoelectric converting element. When the leakage charges generated during a unit period of time are represented by qid, the optical charges are represented by qpn, and the length of the holding period of time is represented by tc, noise charges Qn generated during the holding period of time are (qid+qpn)tc.

The capacitance of the charge holding unit FD is represented by Cfd, the capacitance of the analog memory 24A is represented by Cmem, and a ratio (Cmem/Cfd) of Cfd and Cmem is represented by A. Further, as described above, a gain of the amplifying transistor 4 is represented by $\alpha 1$, and the sum of gains of the analog memory 24A and the sampling transistor 22A is represented by $\alpha 2$. When the signal charges generated by the photoelectric converting element 1A during the exposure period of time are represented by Qph, the signal charges held in the analog memory 24A after the exposure period of time ends are $A \times \alpha 1 \times \alpha 2 \times Qph$.

The signal based on the signal charges transferred from the photoelectric converting element 1A to the charge holding unit FD are sampled and held by the sampling transistor 22A and then stored in the analog memory 24A.

Thus, a period of time until the signal charges are stored in the analog memory 24A after the signal charges are transferred to the charge holding unit FD is short, and the noise generated in the charge holding unit FD is negligible. When the noise generated during a period of time in which the analog memory 24A is holding the signal charges is assumed to be Qn, the S/N is $A \times \alpha 1 \times \alpha 2 \times Qph/Qn$.

Meanwhile, when the signal based on the signal charges held in the charge holding unit FD is read out to the vertical signal line 10A through the amplifying transistor 4 and the selecting transistor 5, the S/N is Qph/Qn. Thus, when the signal based on the signal charges held in the charge holding unit FD is accumulated in the analog memory 24A and then read out to the vertical signal line 10B, the S/N is $A \times \alpha 1 \times \alpha 2$ times the S/N when the signal based on the signal charges held in the charge holding unit FD is read out to the vertical signal line 10A. As the capacitance value of the analog memory 24A is set so that $A \times \alpha 1 \times \alpha 2$ is larger than 1 (for example, the capacitance value of the analog memory 24A is set to be sufficiently larger than the capacitance value of the charge holding unit FD), deterioration in the signal quality can be reduced. The above-described content can be similarly applied to the analog memory 24B.

Figure 9:
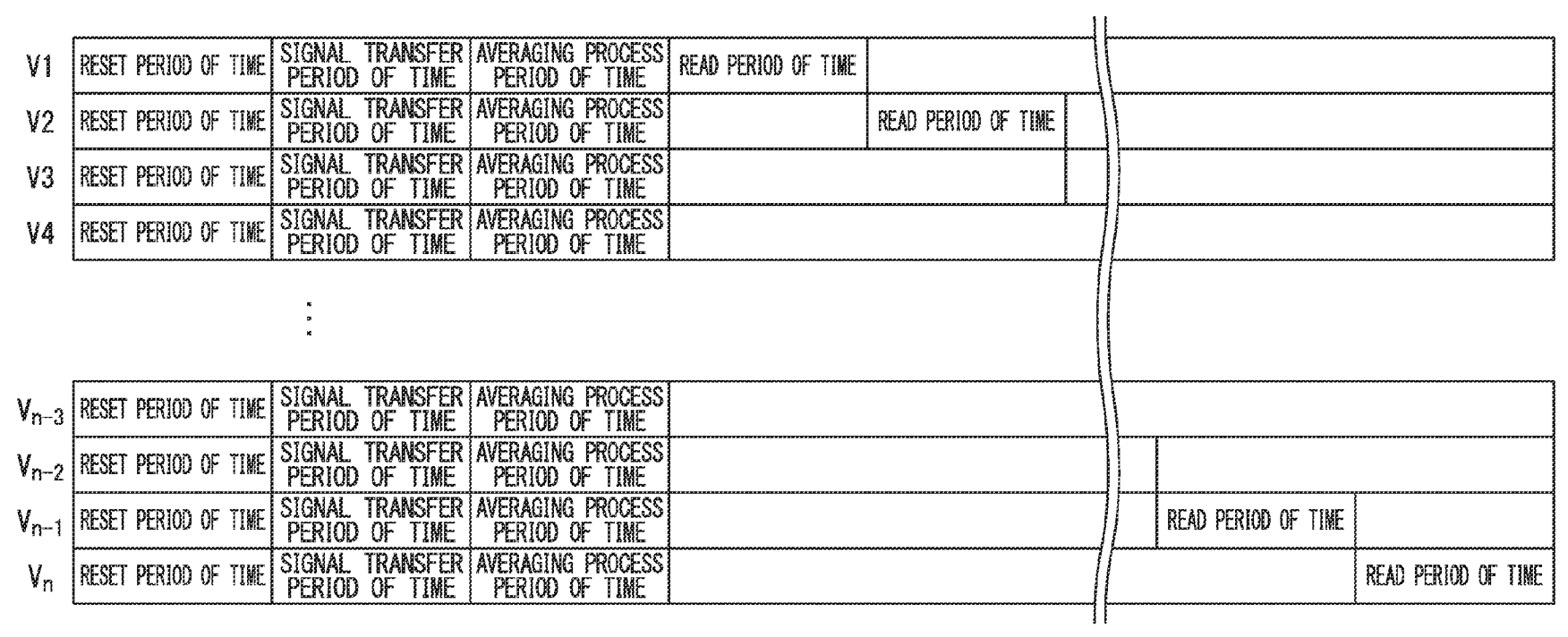

In the global shutter operation of the present embodiment, the unit pixel cell 31 and the unit storage cell 38 which are the same in the position in the vertical direction (hereinafter referred to as a "vertical position") are the same in an operation timing, but the unit pixel cell 31 and the unit storage cell 38 which are different in the vertical position are different in an operation timing. FIG. 9 schematically illustrates operation timings of the unit pixel cell 31 and the unit storage cell 38 which are different in the vertical position (V1, V2, ..., and Vn). In FIG. 9, the position in the vertical direction is represented by the vertical position in the arrays of the unit pixel cells 31 and the unit storage cells 38, and the position in the horizontal direction is represented by a temporal position.

A reset period of time corresponds to the period of time T1 of FIG. 8, a signal transfer period of time corresponds to the periods of time T2, T3, and T4 of FIG. 8, an averaging process period of time corresponds to the period of time T5 of FIG. 8, and a read period of time corresponds to the periods of time T6 and T7 of FIG. 8.

As illustrated in FIG. 9, the unit pixel cell 31 and the unit storage cell 38 which are different in the vertical position are the same in the reset period of time, the signal transfer period of time, and the averaging process period of time. In other words, in these periods of time, the operations are the same regardless of the vertical position. However, the unit pixel cell 31 and the unit storage cell 38 which are different in the vertical position are different in the read period of time. In the global shutter operation, the unit pixels 37 and the unit storage units 39 in the same unit pixel cell 31 and the same unit storage cell 38 are different in light exposure timing, but simultaneity of light exposure can be implemented in the whole unit pixel cell 31 and the whole unit storage cell 38.

Figure 10:
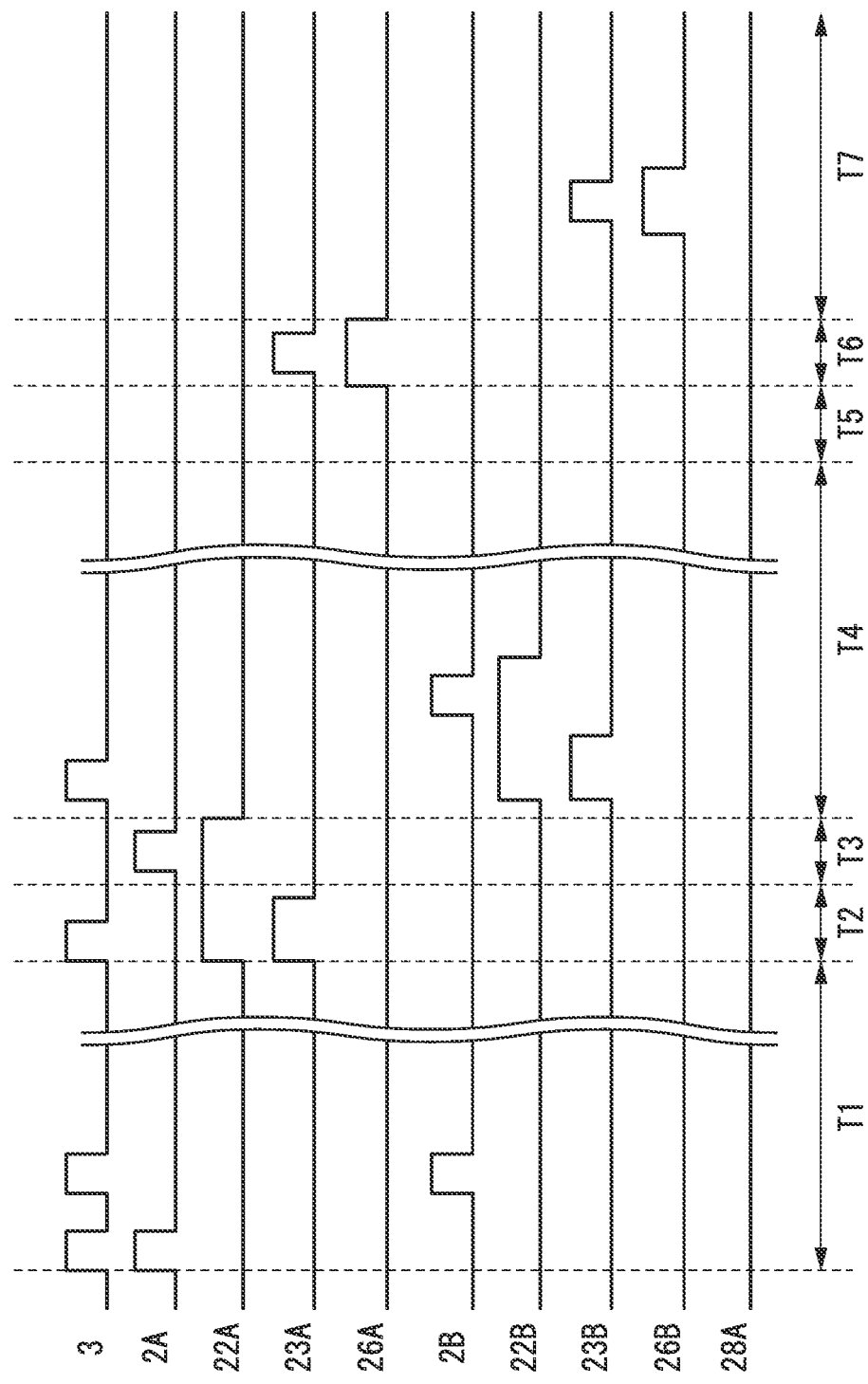
FIG. 10 is a timing chart illustrating operations of a unit pixel cell and a unit storage cell in the solid-state imaging device equipped in the electronic camera according to the first embodiment of the present invention.

Next, FIG. 10 illustrates an example in which signals of the two unit pixels 37 constituting the single unit pixel cell 31 are stored in the unit storage units 39, and the focus detection signal is obtained by individually reading the signals from the unit storage units 39. A difference between FIG. 10 and FIG. 8 lies in that the averaging transistor 28A always remains turned off, averaging is not performed, the signal based on the signal charges accumulated in the analog memory 24A is read in the period of time T6, and then the signal based on the signal charges accumulated in the analog memory 24B is read in the period of time T7. The remaining points are the same as in FIG. 8, and thus a description thereof will be omitted. When the focus detection signal is obtained, the same operation as the operation illustrated in FIG. 9 is performed except that the processing of the averaging process period of time in FIG. 9 is not performed.

The operation illustrated in FIG. 10 is performed in the state in which the release button of the operating unit 309a is pressed halfway, but, for example, the operation illustrated in FIG. 8 and the operation illustrated in FIG. 10 may be performed alternately frame by frame, and an image may be displayed using the imaging signal obtained by the operation illustrated in FIG. 8.

As described above, according to the present embodiment, the analog memories 24A and 24B that store signal charges are arranged on the second substrate 102 rather than the first substrate 101 on which the photoelectric converting elements 1A and 1B are arranged. Thus, charges overflowing from the photoelectric converting elements 1A and 1B or charges generated by light incident to the photoelectric converting elements 1A and 1B can be prevented from flowing into the analog memories 24A and 24B, and the occurrence of noise can be suppressed. Accordingly, it is possible to secure simultaneity in an exposure timing of a focus detection signal of a single frame while acquiring a focus detection signal of a high S/N. In addition, an electronic camera having a high-accuracy focus detection function can be implemented.

Further, since the analog memories 24A and 24B are formed, deterioration in signal quality can be reduced. Particularly, when the capacitance values of the analog memories 24A and 24B are set to be larger than the capacitance value of the charge holding unit FD (for example, the capacitance values of the analog memories 24A and 24B are set to be five times the capacitance value of the charge holding unit FD), the signal charges held by the analog memories 24A and 24B are more than the signal charges held by the charge holding unit FD. Thus, influence of signal deterioration caused by leakage currents of the analog memories 24A and 24B can be reduced.

Further, since the clamp capacitor 21 and the sampling transistors 22A and 22B are formed, noise generated in the first substrate 101 can be reduced. As the noise generated in the first substrate 101, there is noise (for example, reset noise) generated in the input portion of the amplifying transistor 4 due to an operation of a circuit (for example, the reset transistor 3) connected to the amplifying transistor 4 and noise (for example, and noise caused by a variation in a circuit threshold value of the amplifying transistor 4) caused due to an operational characteristic of the amplifying transistor 4.

Further, a signal when the analog memories 24A and 24B are reset and a signal according to a variation in an output of the amplifying transistor 4 which is generated as the signal charges are transferred from the photoelectric converting elements 1A and 1B to the charge holding unit FD are output in a time division manner, and the differential process of each signal is performed. As a result, noise generated in the second substrate 102 can be reduced. As the noise generated in the second substrate 102, for example, there is noise (example, reset noise) generated in the input portions of the amplifying transistors 25A and 25B due to an operation of a circuit (for example, the reset transistors 23A and 23B) connected to the amplifying transistors 25A and 25B.

(Second Embodiment)

Figure 11A:
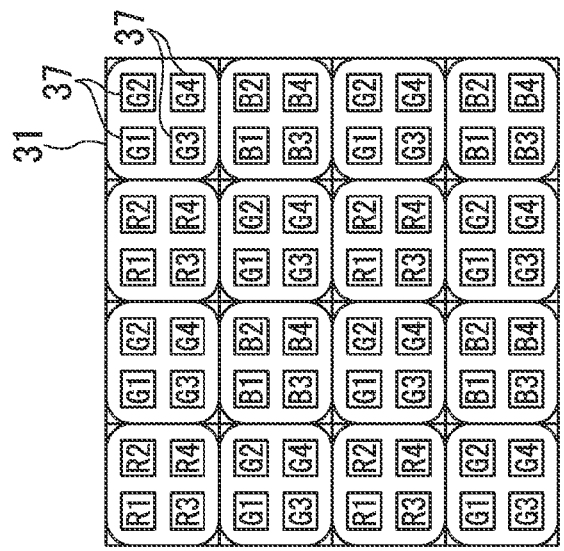
FIGS. 11A, 11B and, 11C are a reference diagram illustrating a correspondence relationship between unit pixel cells and unit storage cells and respective colors in a solid-state imaging device equipped in an electronic camera according to a second embodiment of the present invention.
Figure 11B:
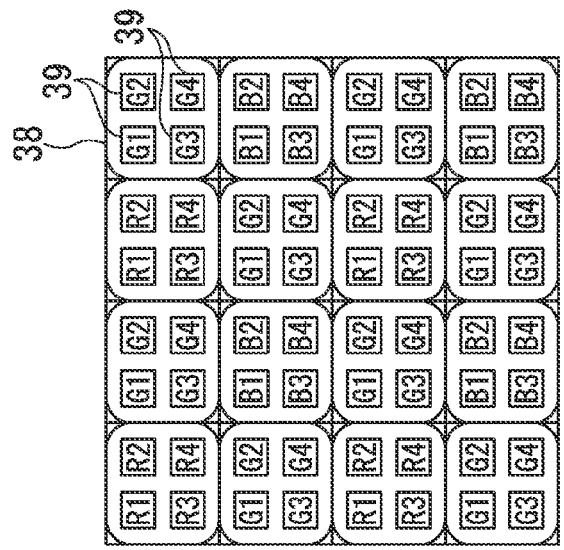
Figure 11C:
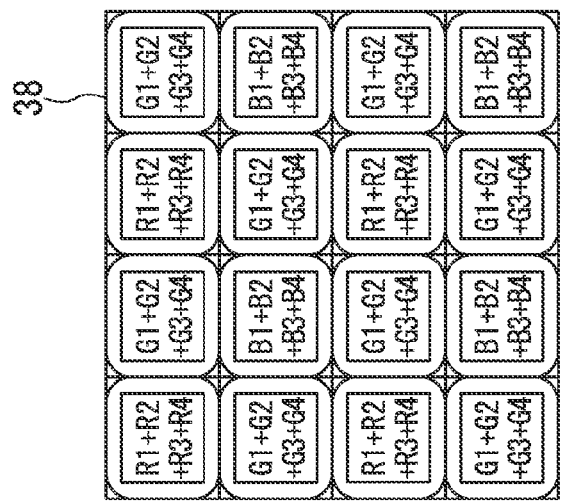

Next, a second embodiment of the present invention will be described. FIGS. 11A, 11B, and 11C illustrate a correspondence relationship between the unit pixel cell 31 and the unit pixel 37 according to the present embodiment and a correspondence relationship between the unit storage cell 38 and the unit storage unit 39. As illustrated in FIGS. 11A, 11B, and 11C, the unit pixel cell 31 of the present embodiment includes four unit pixels 37, and the unit storage cell 38 includes four unit storage units 39. Through this constitution, the focus detection signal can be obtained by reading signals accumulated in the four unit storage units 39, and the imaging signal can be obtained by averaging signals accumulated in the four unit storage units 39.

In the present embodiment, the focus detecting unit 310 detects the defocus amount of the shooting lens 302 based on image patterns of one or more sets of pupil division images among the four focus detection signals respectively obtained from the four unit storage units 39. In the present embodiment, two focus detection signals obtained from the two unit storage units 39 adjacent in the horizontal direction, the two unit storage units 39 adjacent in the vertical direction, the two unit storage units 39 adjacent in the diagonal direction, or the like constitute a set of focus detection signals.

According to the present embodiment, it is possible to secure simultaneity in an exposure timing of a focus detection signal in a single frame while acquiring a focus detection signal of a high S/N, and a more accurate signal for focus detection can be obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device, comprising:
a first substrate;
a second substrate; and
a connector configured to connect the first substrate with the second substrate,
wherein the first substrate includes
a first photoelectric converting unit,
a second photoelectric converting unit, a transfer unit configured to transfer signal charges of the first photoelectric converting unit and signal charges of the second photoelectric converting unit to the connector, and a microlens configured to cause light to be incident on the first photoelectric converting unit and the second photoelectric converting unit, the second substrate includes a first memory unit configured to hold the signal charges as an analog signal transferred from one of the first photoelectric converting unit and the second photoelectric converting unit to the connector, a second memory unit configured to hold the signal charges as another analog signal transferred from the other of the first photoelectric converting unit and the second photoelectric converting unit to the connector, and an averaging unit configured to average the signal charges held in the first memory unit and the signal charges held in the second memory unit, and at least one of the first substrate and the second substrate includes a control unit configured to perform a control in a first mode in which focus detection signals are individually read based on the signal charges held in the first memory unit and the signal charges held in the second memory unit and to perform a control in a second mode in which an imaging signal is read based on the signal charges averaged by the averaging unit.

2. The solid-state imaging device according to claim 1, further comprising, a plurality of unit pixels arranged in a form of a matrix, wherein the first photoelectric converting unit and the second photoelectric converting unit are arranged corresponding to each of the unit pixels, and the first mode includes a step of transferring the signal charges from one of the first photoelectric converting unit and the second photoelectric converting unit to the connector and holding the signal charges in the first memory unit at the same time in the plurality of unit pixels, a step of transferring the signal charges from the other of the first photoelectric converting unit and the second photoelectric converting unit to the connector and holding the signal charges in the second memory unit at the same time in the plurality of unit pixels, and a step of sequentially reading a focus detection signal based on the signal charges held in the first memory unit and a focus detection signal based on the signal charges held in the second memory unit in the unit pixels at the same vertical position.

3. An electronic camera, comprising:

the solid-state imaging device according to claim 1;

a focus detecting unit configured to detect deviation of a pupil division image based on the focus detection signal output from the solid-state imaging device, and to perform focus detection;

and an image processing unit configured to process the imaging signal output from the solid-state imaging device.

* * * * *